United States Patent
Yeh et al.

(10) Patent No.: US 6,690,601 B2
(45) Date of Patent: Feb. 10, 2004

(54) NONVOLATILE SEMICONDUCTOR MEMORY CELL WITH ELECTRON-TRAPPING ERASE STATE AND METHODS FOR OPERATING THE SAME

(75) Inventors: Chih-Chieh Yeh, Taipei (TW); Wen-Jer Tsai, Hualien (TW); Tao-Cheng Lu, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/113,356

(22) Filed: Mar. 29, 2002

(65) Prior Publication Data

US 2003/0185055 A1 Oct. 2, 2003

(51) Int. Cl.[7] .............................................. G11C 16/00
(52) U.S. Cl. ......................... 365/185.28; 365/185.29; 365/185.18
(58) Field of Search ................... 365/185.28, 185.29, 365/185.33, 185.17, 185.18

(56) References Cited

U.S. PATENT DOCUMENTS

| | | | | |
|---|---|---|---|---|
| 5,168,334 A | | 12/1992 | Mitchell et al. ............ 257/324 |
| 5,768,192 A | | 6/1998 | Eitan ...................... 365/185.24 |
| 6,011,725 A | * | 1/2000 | Eitan ...................... 365/185.33 |
| 6,134,150 A | * | 10/2000 | Hsu et al. .............. 365/185.29 |
| 6,215,702 B1 | * | 4/2001 | Derhacobian et al. . 365/185.29 |
| 6,272,050 B1 | * | 8/2001 | Cunningham et al. . 365/185.28 |
| 6,282,123 B1 | * | 8/2001 | Mehta ..................... 365/185.28 |
| 6,366,499 B1 | * | 4/2002 | Wang et al. ........... 365/185.28 |
| 6,404,681 B1 | * | 6/2002 | Hirano ................... 365/185.33 |
| 6,487,114 B2 | * | 11/2002 | Jong et al. ............. 365/185.03 |
| 6,487,121 B1 | * | 11/2002 | Thurgate et al. ....... 365/185.18 |

* cited by examiner

Primary Examiner—Tan T. Nguyen
(74) Attorney, Agent, or Firm—Baker & McKenzie (57) ABSTRACT

A preferred embodiment of the invention provides a trapping nonvolatile memory cell comprising a P type semiconductor substrate with a N+ source and a N+ drain being formed on the semiconductor substrate, a channel being formed between the source and the drain. A first isolating layer, a nonconducting charge trapping layer, a second isolating layer and a gate are sequentially formed above the channel. The trapping layer stores an amount of electrons as the nonvolatile memory cell is erased.

35 Claims, 10 Drawing Sheets

Fig. 6A Read Bit 2 (low)

Fig. 6B Read Bit 2 (High)

Fig. 6C Read Bit 1 (low)

Fig. 6D Read Bit 1 (high)

NONVOLATILE SEMICONDUCTOR MEMORY CELL WITH ELECTRON-TRAPPING ERASE STATE AND METHODS FOR OPERATING THE SAME

FIELD OF THE INVENTION

The invention generally relates to semiconductor memory devices and more particularly to a nonvolatile semiconductor memory cell with electron trapping and methods for operating the same.

BACKGROUND OF THE INVENTION

Memory devices for nonvolatile storage of information are in widespread use in the art. Exemplary nonvolatile semiconductor memory devices include read only memory (ROM), programmable read only memory (PROM), erasable programmable read only memory (EPROM), electrically erasable programmable read only memory (EEPROM) and flash EEPROM.

Flash EEPROMs are similar to EEPROMs in that memory cells can be programmed (i.e., written) and erased electrically but with the additional capability of erasing all memory cells at once. The widespread use of EEPROM semiconductor memory has prompted much research focusing on developing an EEPROM memory cell with optimal performance characteristics such as shorter programming times, lower voltage usage for programming and reading, longer data retention time, shorter erase time and smaller physical dimensions.

Figure 1:
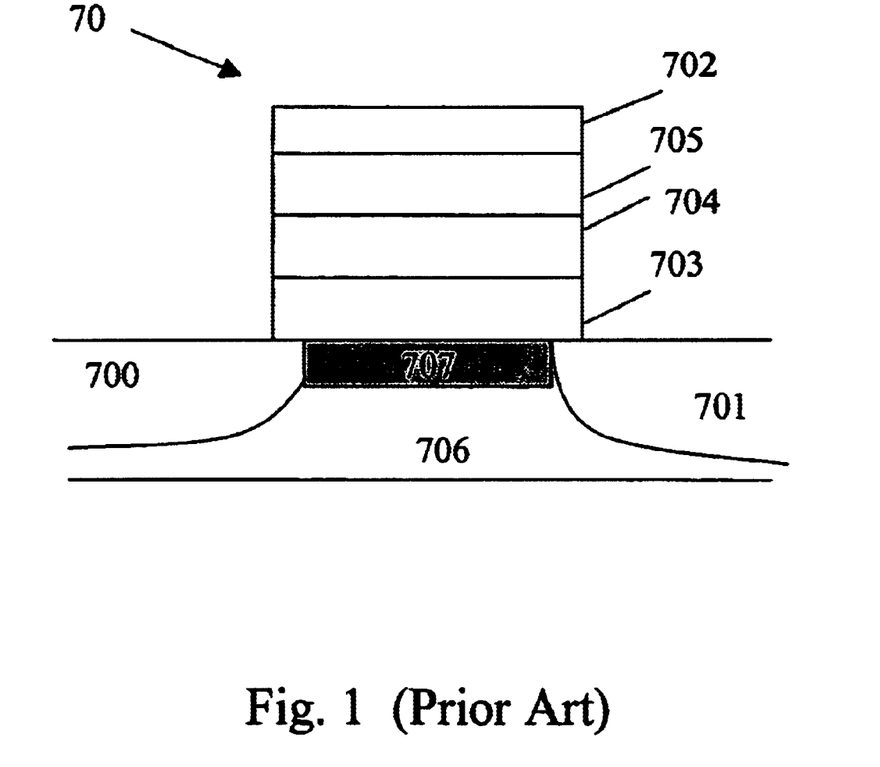
FIG. 1 is schematic view illustrating a nonvolatile memory cell in the prior art.

FIG. 1 is a block diagram that illustrates the structure of a prior art nonvolatile memory cell where a nonvolatile memory cell 70 includes an N-channel MOSFET structure. The nonvolatile memory cell 70 includes a P type substrate 706 with two buried N+ junctions, one being the source 700 and the other being the drain 701. A channel 707 is formed between the source 700 and the drain 701. Above the channel is a first isolating layer 703, which generally is a silicon oxide layer. On top of the first isolating layer 703 is a trapping layer 704, which generally is a nitride layer. The trapping layer 704 forms the memory retention layer that traps the hot electrons as they are injected into the nitride layer. A second isolating layer 705, which generally is an oxide layer, is formed to overlay the silicon nitride layer. The silicon oxide layer 705 electrically isolates a conductive gate 702 formed over the second isolating layer 705. The two silicon oxide layers 703 and 705 function as isolation dielectric layers.

This prior art structure can provide a two-bit cell, i.e., the nonvolatile memory cell can store two bits of data. The memory is programmed by channel hot electron injection. By applying programming voltages to the gate 702 and the drain 701 while the source 700 is grounded, electrons can be accelerated sufficiently to be injected into the trapping layer 704 near the drain side 701 so as to increase the energy barrier in the channel 707 near the drain side 701 where a bit of data is stored therein. In addition, electrons can be injected into the trapping layer 704 near the source side 702 to increase the energy barrier in the channel 707 near the source side 701 where another bit of data is stored therein. Provided that the trapping layer 704 includes an appropriate width, the two areas storing electrons in the trapping layer 704 can be identified and used for storing two bits of data.

Regarding the energy barrier of the prior art nonvolatile memory cell, the trapping layer is in a neutral state. When no charge is stored in the trapping layer, the energy barrier in the channel 707 is at a low state. In programming the nonvolatile memory cell, the electrons are injected into the trapping layer near, e.g., the drain 701, so that the energy barrier in the channel 707 near the drain 701 is increased. Moreover, when the electrons are injected into the trapping layer 704 near the source 700, the energy barrier in the channel 707 near the source 700 is increased. The energy barrier in the channel 707 thus includes two high-level sections distributed at two sides of the energy barrier.

Conventional programming using hot electron injection requires high operating voltages and consumes high power. As the size of the nonvolatile cell is reduced and the channel is relatively small, the high operating voltage induces a punch-through effect resulting in high leakage current and low program efficiency. Such becomes a significant design and implementation shortcoming in prior art nonvolatile memory devices serving as two-bit memory cells. Further, the prior art structure requires a particularly confined size, which impedes engineering efforts on size and cost reduction therefor.

Thus, there is a general need in the art for a nonvolatile memory device with an optimal two-bit cell structure, and more particularly, a nonvolatile memory device and associated methods therefor that overcome at least the aforementioned disadvantages of nonvolatile memory devices in the art. In particular, there is a need in the art for a nonvolatile memory device with amplified effects for the trapped electron charges in the trapping dielectric layer and an optimally reduced size.

SUMMARY OF THE INVENTION

A preferred embodiment of the invention provides a trapping nonvolatile memory cell comprising a P type semiconductor substrate, a source which is a buried N+ junction area, a drain spaced from the source which is also a buried N+ junction area, a channel being formed in a space between the source and the drain and within the semiconductor substrate, a first isolating layer overlying and covering the channel, a nonconducting charge trapping layer formed on and overlaying the first isolating layer, a second isolating layer formed on and overlaying the nonconducting charge trapping layer, a gate comprising an electrically conductive material formed on and overlaying the second isolating layer.

In this particular embodiment of the nonvolatile memory cell structure according to the invention, the nonconducting charge trapping layer is formed so as to receive and retain electrons injected to the nonconducting charge trapping layer in a first charge storage region close to the drain for storing digital data, and a second charge storage region close to the source. For the erase state in operating the nonvolatile memory according to the invention, electrons are stored in the nonconducting charge trapping layer. In programming the nonvolatile memory according to the invention, electric holes are injected into the nonconducting charge trapping layer. Moreover, a tunneling layer can be added between the channel and the first isolating layer so as to reduce the injecting energy barrier from the channel to the trapping layer wherein the electrons and holes are readily injected into the trapping layer in the operation mode.

The invention further provides a method for programming one bit in a trapping nonvolatile memory cell in accordance with the invention. An embodiment of the method according to the invention comprises the steps of applying a first voltage difference between a selected electrode of the source and the drain and the gate, where the first voltage difference is small enough to cut off a charge flow from the selected electrode to the gate so that no current flow occurs therebetween, and applying a second voltage difference between the gate and a second electrode of the source and the drain, where the second voltage difference is large enough to form an electric field that induces a current along a path from the second electrode to the trapping layer. Moreover, two bits can be programmed at generally the same time by applying the second voltage difference to the source and drain in a generally simultaneous manner.

The invention further provides a method for reading one bit in a trapping nonvolatile memory cell. An embodiment of the method according to the invention comprises the steps of applying a first voltage difference between a selected electrode of the source and the drain and the gate, where the first voltage difference is large enough to turn on the selected electrode and the gate, and grounding a second electrode of the source and the drain, where the bit state on the side of the second electrode is accordingly read and output.

In addition, the invention provides a method for erasing a trapping nonvolatile memory cell. An embodiment of the method according to the invention comprises the steps of applying a voltage between the gate and the semiconductor substrate including the source and the drain, where the voltage is large enough to form a tunnel so as to induce an electric current along a path from the semiconductor substrate having the source and the drain to the trapping layer. Moreover, the voltage can be reversely added so as to form a tunnel to induce an electric current along a path from the gate to the trapping layer.

The invention further provides a method for erasing a trapping nonvolatile memory cell by adding a series of pulses. According to an embodiment of the method according to the invention, a series of bipolar pulses are input into a selected electrode of the drain and the source while another electrode of the drain and source is being floated. Each of the pulse includes a second voltage and a third voltage smaller than the second voltage, where the third voltage is enough to cause electrons to be drawn out from the selected electrode. Moreover, the second voltage is enough to cut off the electron current flow from the selected electrode to the semiconductor substrate and to induce the electrons to inject into the trapping layer. In addition, the pulses can be input from the source and drain synchronously, or directly input from the semiconductor substrate.

The invention further provides a method for erasing a trapping nonvolatile memory cell. An embodiment of the method according to the invention comprises the steps of making an N well enclosing the semiconductor substrate, grounding or floating the drain and the source, and applying voltages to the gate, the P well and the N well, thereby causing an electron current path to induce electrons to flow from the N well to the P well and then be injected into the trapping layer through the first isolating layer. Moreover, instead of using an N well, a N+ injector can be formed in the semiconductor substrate.

BRIEF DESCRIPTION OF THE DRAWINGS

The preferred and other embodiments of the invention are further described in detail below in conjunction with the accompanying drawings (not necessarily drawn to scale), in which.

DETAILED DESCRIPTION OF THE PREFERRED EMBODIMENTS

The details of the invention will be described hereinafter in conjunction with the appended drawings. Those ordinarily skilled in the art should understand that the following includes exemplary descriptions of the invention. Modifications and variations within the scopes and spirits of the invention are accordingly covered by the scope of the invention, which is defined by the appended claims and their equivalents.

Figure 2:
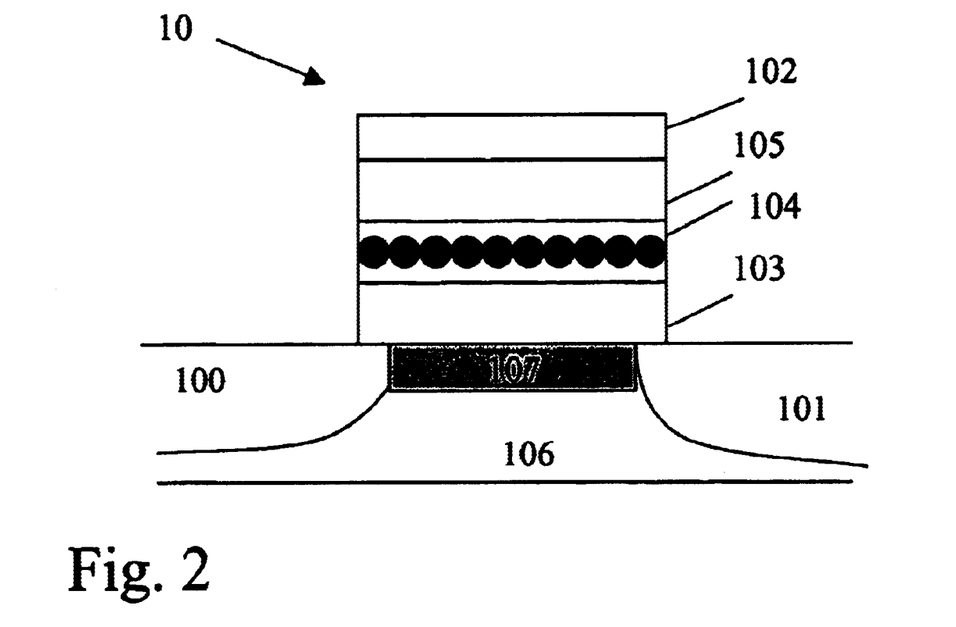
FIG. 2 is a schematic view illustrating a preferred embodiment of the nonvolatile memory cell of the invention.

The nonvolatile memory cell 10 according to an embodiment of the invention is illustrated in FIG. 2. The nonvolatile memory cell 10 includes an N-channel MOSFET structure in general. In the nonvolatile memory cell 10, a P type substrate 106 includes two buried N+ junctions, one being the source 100 and the other being the drain 101. A channel 107 is formed between the source 100 and the drain 101. Above the channel is a first isolating layer 103, which generally is a silicon oxide layer. On top of the first isolating layer 103 is a trapping layer 104, which generally is a nitride layer. The trapping layer 104 forms the memory retention layer for trapping the electrons as they are injected into the nitride layer. A second isolating layer 105, which generally is an silicon oxide layer, is formed to overlay the silicon nitride layer. The silicon oxide layer 105 functions to electrically isolate a conductive gate 102 formed over the second isolating layer 105. The two silicon oxide layers 103 and 105 function as isolation dielectric layers.

Numerous advantages of the invention lie in the manner in which the nonvolatile memory cell 10 is programmed, read and erased. In the erase state, electrons are stored in the nitride layer, so that the energy level in the channel is normally at a high state. In programming the nonvolatile memory cell 10, hot electric holes are injected into the trapping layer 104 from the source 100 or the drain 101 so as to change the energy barrier.

In operating the nonvolatile memory cell according to the invention, it is desirable to inject the electric holes or electrons into the trapping layer 104 at high speed. It is further desirable to retain the electrons or holes in the trapping layer when the nonvolatile memory cell is not operational. According to a particular embodiment of the invention, for an isolation layer (such as the first isolating layer 103) the energy barrier is 3.2 eV for electrons and 4.9 eV for the electric holes. Such has a generally equal effect on the electrons and electric holes drawn out of the trapping layer 104 and electrons and holes injected into the trapping layer 104 through the first isolating layer 103. It is further desirable to steadily retain the electrons or electric holes in the trapping layers 104 when the nonvolatile memory cell is not operational. Conversely, when the nonvolatile memory cell according to the invention is operational, the electrons and holes are readily injected into the trapping layer 104. That is, the electrons and electric holes are passed through an isolation layer with lower energy barriers so as to speed up the operation of the nonvolatile memory cell.

Figure 3:
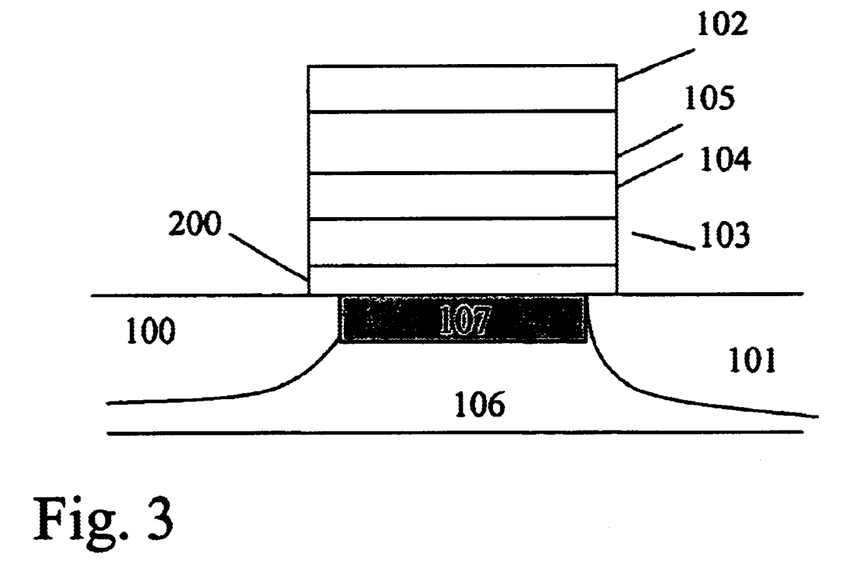
FIG. 3 is a schematic view illustrating a further embodiment of the nonvolatile memory cell of the invention with a tunneling layer.

FIG. 3 is a schematic view illustrating a further embodiment of the nonvolatile memory cell of the invention with a tunneling layer. A tunnel layer 200 is provided between the channel 107 and the first isolating layer 103. The structure disclosed in FIG. 3 is generally similar to the one disclosed in FIG. 2, except that a tunnel layer 200 is added between the channel 107 and the first isolating layer 103. The material of the tunnel layer 200 is particularly selected to provide lower energy barriers to the electrons and electric holes than those of the first isolating layer 103 where the electrons and holes are readily injected into the trapping layer and thus the speed in charge storing in the trapping layer 104 is accordingly increased. Since the first isolating layer 103 remains next to the trapping layer 104, the electrons or electric holes in the trapping layer 104 are retained therein as well. According to a particular embodiment of the invention, materials for the tunnel layer 200 can be selected from tantalum oxide or BST (i.e., a compound of barium, strontium, and tantalum).

In the erase state in operating the nonvolatile memory according to this particular embodiment of the invention, the electrons are stored in the trapping layer 104. In programming the nonvolatile memory according to the invention, hot electric holes are injected into the trapping layer 104.

Figure 4A:
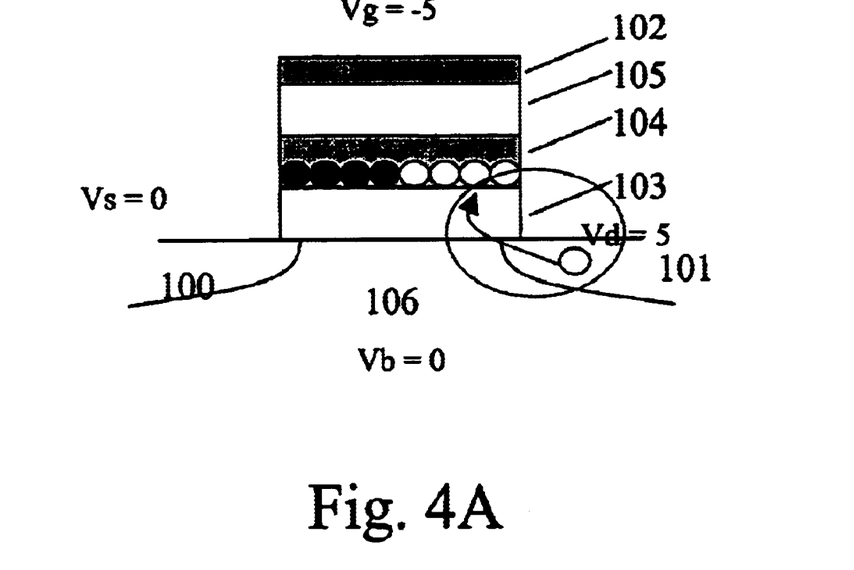
FIGS. 4A and 4B are a schematic views respectively illustrating an exemplary operation of programming the source bit and drain bit of the nonvolatile memory cell according to an embodiment of the invention.
Figure 4B:
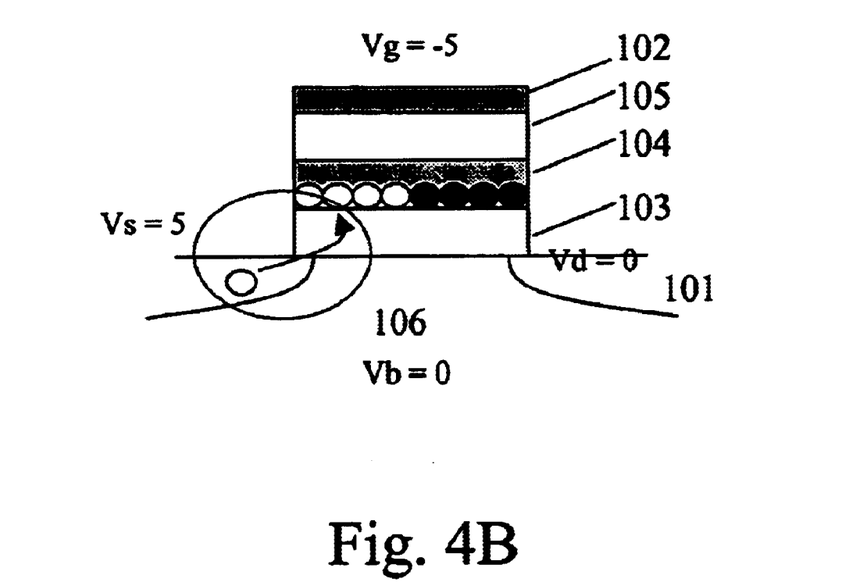

The operation of the flash memory cell 100 from the drain bit is described herein and below in further detail. FIG. 4A is a schematic view that illustrates an exemplary operation for programming the drain bit according to the invention. To program or write the nonvolatile memory cell of the invention, a voltage difference is formed between the drain 101 and the gate 102, where the source 100 is grounded. For example, a voltage of −5 volts (V) is applied to the gate 102 and 5 V is applied to the drain 101. These voltages generate a vertical and lateral electric field along the length of the channel from the drain 101 to the gate 102. This electric field causes the electric(electron) holes to be drawn off the drain 101 and accelerate towards the source. The electric(electron) holes gain energy as they move along the length of the channel. When the electric(electron) holes gain sufficient energy, they are able to jump over the potential barrier of the silicon oxide layer 103 into the trapping layer 104 where they are trapped. The probability of this occurring is at a maximum in the region of the gate next to the drain 101 because it is near the drain 101 where the holes gain the most energy. These accelerated holes are termed hot holes. Once the hot holes are injected into the nitride layer they become trapped and remain stored therein. The trapped holes cannot spread through the nitride layer because of the low conductivity of the nitride layer and the lateral electric field. Thus, the trapped charge remains in a localized trapping region typically located close to the drain. Moreover, FIG. 4B is a schematic view that illustrates an exemplary operation for programming the source bit according to the invention. The programming of the source bit is generally similar to the programming of the drain bit, except that the voltages applied to the source 100 and drain 101 is interchanged so as to generate a different effect.

Figure 5A:
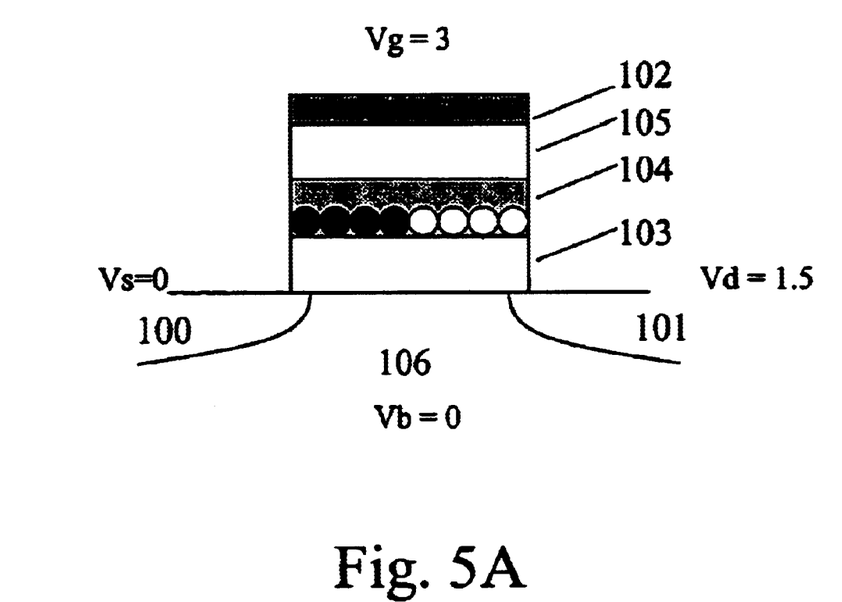
FIGS. 5A and 5B are schematic views respectively illustrating an exemplary operation of reading the source bit and drain bit of the nonvolatile memory cell according to another embodiment of the invention.
Figure 6A:
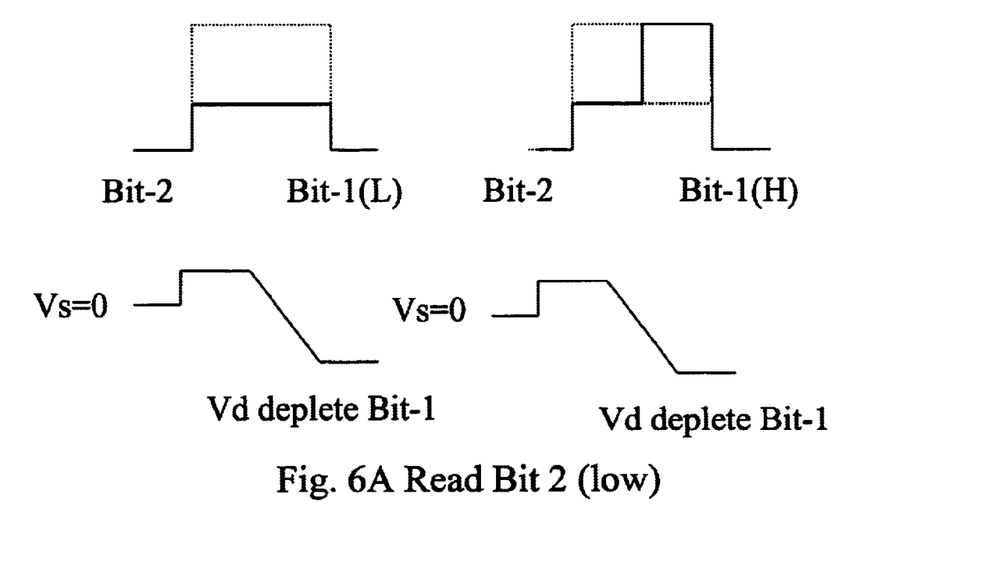
FIG. 6A illustrates an exemplary energy barrier distribution and voltage distribution for reading one bit near the source as the bit is at low state with the bit near the drain in low and high states.
Figure 6B:
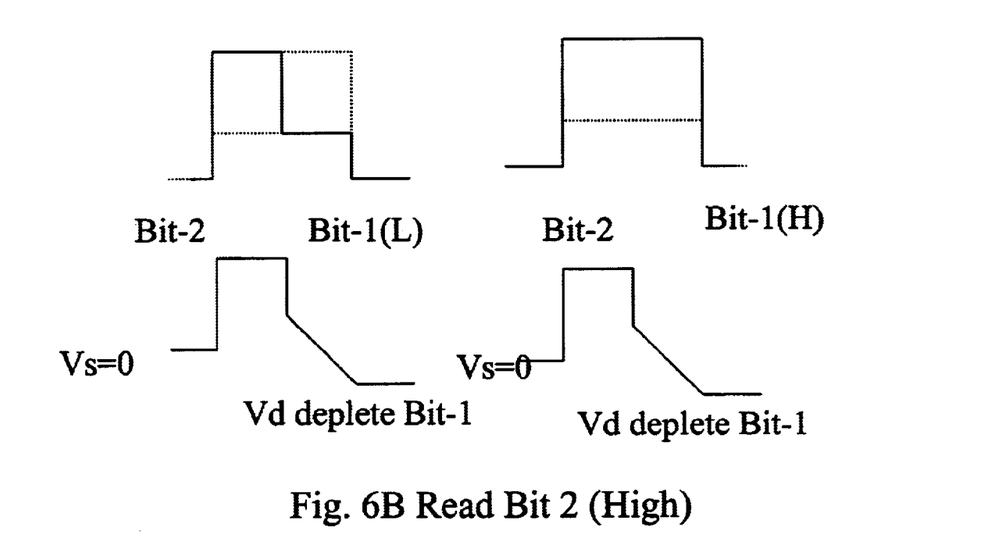
FIG. 6B illustrates an exemplary energy barrier distribution and voltage distribution for reading one bit near the source as the bit is at a high state with the bit near the drain in low and high states.

FIG. 5A is a schematic view that illustrates an exemplary operation of reading the source bit of the nonvolatile memory cell according to the invention. If it is desired to read a bit stored in the trapping layer near the source 100, a positive voltage is applied to the gate 102 and the drain 101 while the source 100 is grounded. The lower limit for the positive voltage applied to the gate 102 is the voltage at which sufficient inversion is generated in the channel 107 where by the programmed state can be sensed. The positive voltage applied to the drain 101 reduces the energy barrier and potential across the bit stored near the drain 101, resulting in the channel current. FIG. 6A illustrates the energy barrier distribution and voltage distribution for reading the bit near the source as it is at low state with the bit near the drain in low and high states. FIG. 6B illustrates the energy barrier distribution and voltage distribution for reading the bit near the source as it is at a high state with the bit near the drain in low and high states.

Figure 5B:
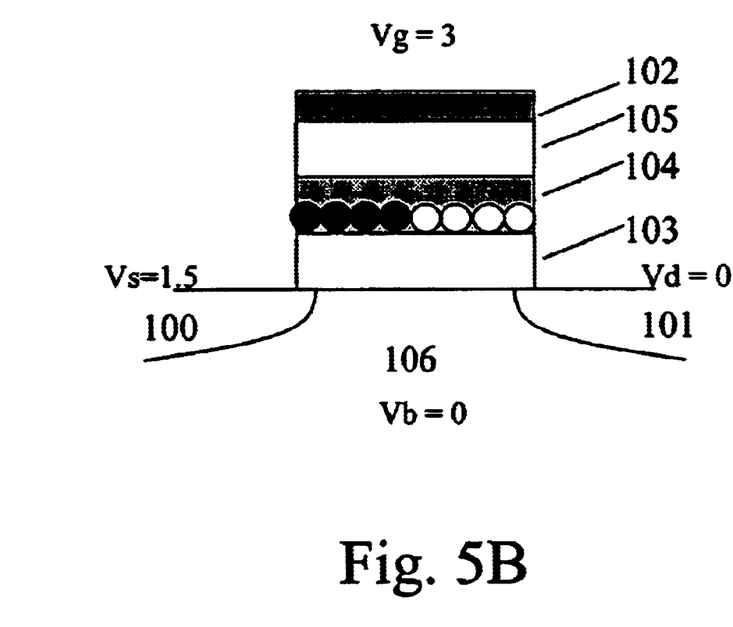
Figure 6C:
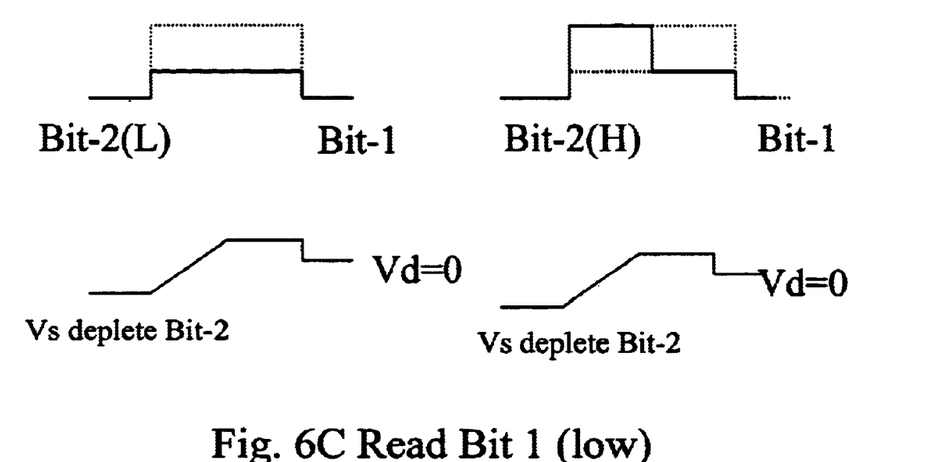
FIG. 6C illustrates an exemplary energy barrier distribution and voltage distribution for reading one bit near the drain as the bit is at low state with the bit near the drain in low and high states.
Figure 6D:
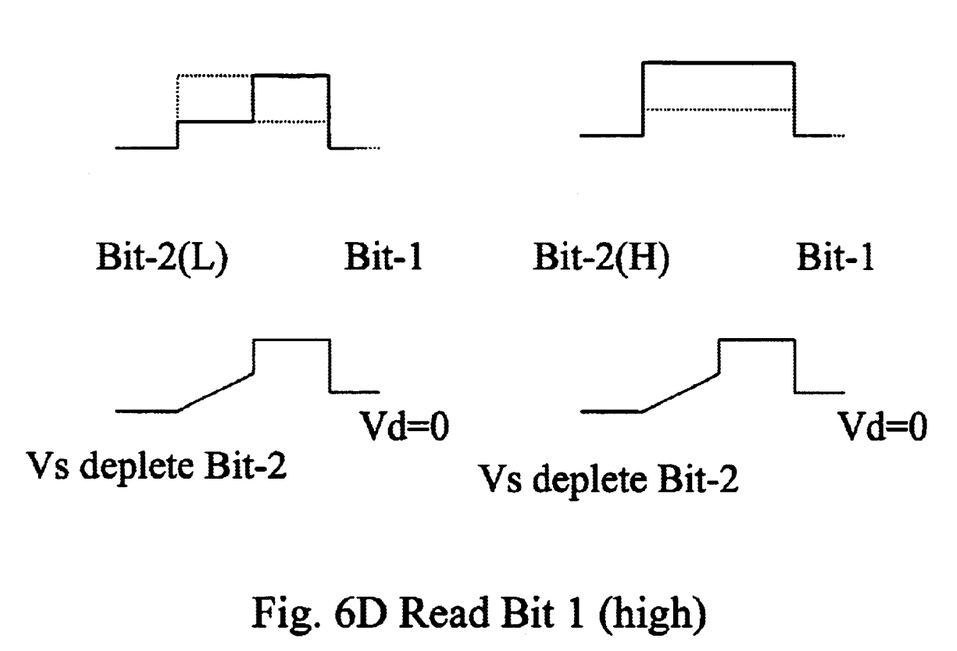
FIG. 6D illustrates an exemplary energy barrier distribution and voltage distribution for reading one bit near the drain as the bit is at a high state with the bit near the drain in low and high states.

When the device reads the bit in the trapping layer 104 near the drain, as illustrated in FIG. 5B, a positive voltage is applied to the gate 102 and source 100 while the drain 101 is grounded. The lower limit for the positive voltage applied to the gate 102 is the voltage at which sufficient inversion is generated in the channel 107 where by the programmed state can be sensed. The positive voltage applied to the source 100 reduces the energy barrier and potential across the bit stored near the source 100, resulting in the channel current. FIG. 6C illustrates the energy barrier distribution and voltage distribution for reading the bit near the drain as it is in a low state with the bit near the drain in both low and high states. FIG. 6D illustrates the energy barrier distribution and voltage distribution for reading the bit near the drain as it is in a high state with the bit near the drain in both low and high states.

Figure 7:
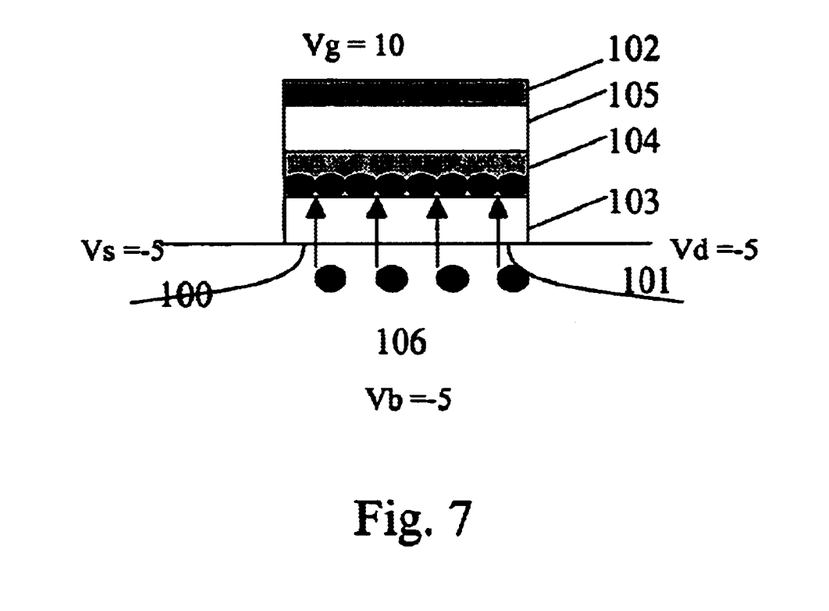
FIG. 7 illustrates an exemplary erase operation according to the invention where electrons are injected into the trapping layer from the semiconductor substrate.

FIG. 7 illustrates an exemplary erase operation of the FN (Fowler-Nordheim) injection method according to an embodiment of the invention where electrons are injected into the trapping layer from the semiconductor substrate. The nonvolatile memory cell according to the invention is erased using uniform electron injection by Fowler-Nordheim tunneling with a positive gate-to-drain/source/substrate bias for substrate injection. To erase the nonvolatile memory cell, a substrate injection method is utilized. Voltages are applied to the source 100, drain 101, substrate 106 and the gate 102. For example, a voltage of 10 V is applied to the gate and a voltage of −5 V is applied to the drain 101, substrate 106 and source 100. These voltages generate a vertical electric field along the channel region 106 to the gate 102. This electric field causes electrons to be drawn out of the channel region which then tunnel towards the gate. The electrons are able to tunnel through the potential barrier of the silicon oxide layer 103 to be injected into the trapping layer 104 where they are trapped. The tunneling electrons are injected into the nitride layer where they are trapped and remain stored therein.

Figure 8:
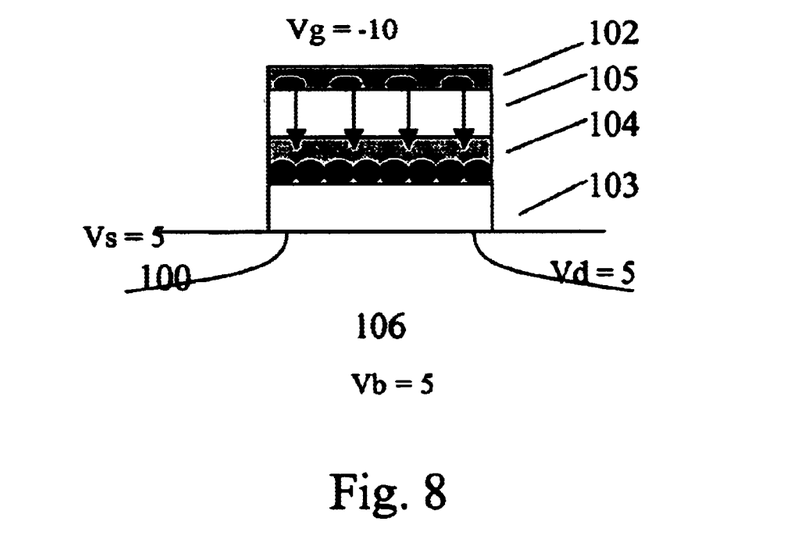
FIG. 8 illustrates another exemplary erase operation according the invention where electrons are injected into the trapping layer from the gate.

Furthermore, voltages can be used for an erase operation of the nonvolatile memory cell according to the invention using a negative gate-to-drain/source/substrate bias for substrate injection. FIG. 8 illustrates another exemplary erase operation according the invention where electrons are injected into the trapping layer from the gate using the FN (Fowler-Nordheim) injection method. Voltages are accordingly applied to the source 100, the drain 101, substrate 106 and the gate 102. For example, a voltage of −10 V is applied to the gate and 5 V is applied to the drain 101, substrate 106 and source 100. These voltages generate a vertical electric field along the length of the gate 102 to the nitride layer 104. This electric field causes electrons to be drawn off the gate 102 and to tunnel towards the nitride layer 104. The electrons are able to tunnel through the potential barrier of the second isolation layer 105 into the trapping layer 104 where they are trapped. These tunneling electrons are injected into the trapping layer where they are trapped and remain stored therein.

Figure 9:
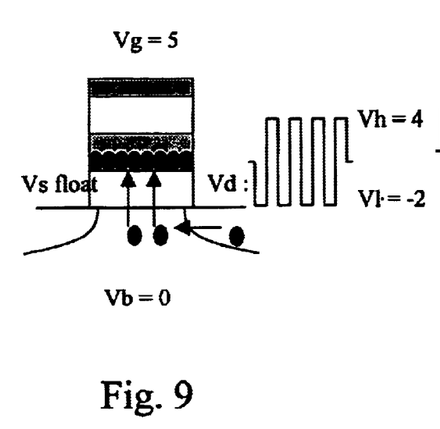
FIG. 9 illustrates an exemplary erase operation for the flash memory cell according the invention using hot electron injection from the drain by pulse agitating the substrate.

FIG. 9 illustrates an exemplary erase operation for the flash memory cell according the invention using hot electron injection from the drain by pulse agitating the substrate. The memory cell is erased by pulse-agitating the substrate with hot electron injection, where the gate 102 is positively biased, the source 100 is floated and the substrate is grounded, as a series of bipolar pulses are input to the drain 101. According to this particular embodiment of the invention, the voltage of the gate is 5 V, where the high voltage of the pulse is 4 V and the lower voltage thereof is −2V. As a negative pulse is input to the drain 101, the electrons in the drain consequently flow out of the drain 101 to the source 100. As a result of applying a positive pulse to the drain 101, the channel between drain 101 and source 100 is cut off. As a charge depletion region is formed in the substrate 106 and an electric field is generated along a path from the drain 101 to the gate 102, the electrons flowing out of the drain 101 are directed to the gate 102 and are then trapped in the trapping layer 104 so as to complete the erase operation.

In another embodiment according to the invention, the serial pulses can be input from the source 100 with the drain being floated to achieve generally the same result.

Figure 10:
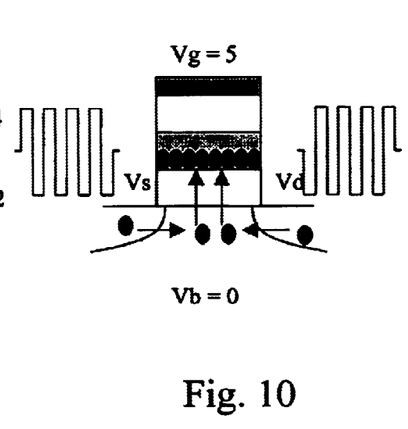
FIG. 10 illustrates another exemplary erase operation of the flash memory cell according to the invention using hot electron injection from the source and drain by pulse agitating the substrate.

FIG. 10 illustrates yet another exemplary erase operation of the flash memory cell according to the invention using hot electron injection from the source and drain by pulse agitating the substrate. According to this particular embodiment of the invention, the gate 102 is positive biased and the substrate 106 is grounded. A series of bipolar pulses are input to the drain 101 and source 100 synchronously. When negative pulses are applied to the source 100 and drain 101, electrons are drawn off the source 100 and drain 101 which then accelerate towards the channel 107. As the positive pulses are applied to the source 100 and drain 101, a charge depletion region is formed in the substrate 106 and a vertical electric field is generated along the path from the channel 107 to the gate 102. The vertical electric field pumps the electrons out of the source 100 and the drain 101 to pass through the first silicon oxide layer 103 to the trapping layer 104. After a filling the trapping layer with electrons for a period of time, the trapping layer 104 is full of electrons so as to erase the original state in the nitride layer.

Figure 11:
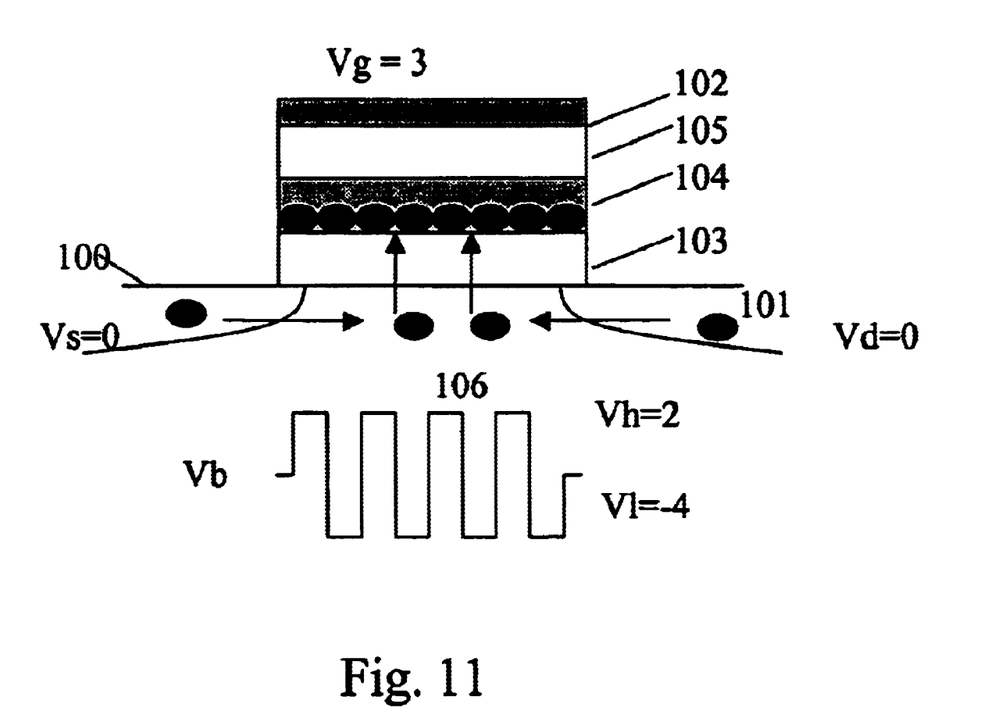
FIG. 11 illustrates yet another exemplary erase operation of the flash memory cell according to the invention using hot electron injection by pulse agitating the semiconductor substrate.

Moreover, the pulse can be directly applied to the substrate 106 for pumping electrons to the trapping layer. FIG. 11 illustrates yet another exemplary erase operation of the flash memory cell according to the invention using hot electron injection by pulse agitating the semiconductor substrate. Electrons are pumped out of the substrate layer 106 which then flow to the trapping layer 104 through the first isolating layer 103. A positive voltage of (e.g., 3 V) is applied to the gate 102 with the source 100 and the drain 101 being grounded. A series of pulses with a high state of 2 V (for example) and a lower level of −4 V (for example) are applied to the substrate 106. As a positive voltage is applied, electrons are drawn out of the source 100 and drain 101. As negative voltage is applied, the electrons out of the source 100 and drain 101 are pumped upwards to the trapping layer 104. After a filling the trapping layer with electrons for a period of time, the trapping layer 104 is full of electrons so as to erase the original state in the nitride layer.

Figure 12:
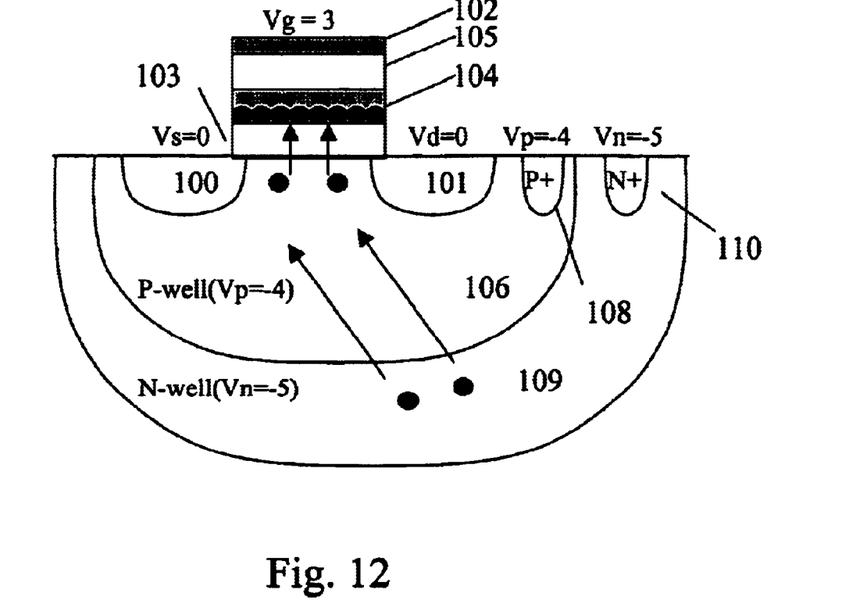
FIG. 12 illustrates a further exemplary erase operation of the nonvolatile memory cell according to the invention using electron injection using electron injection with hot electrons emitted from the N well.

FIG. 12 illustrates a further exemplary erase operation of the nonvolatile memory cell according to the invention using electron injection with hot electrons emitted from the N well. The nonvolatile memory cell according to the invention is erased by hot electron injection, where an N well is provided around the substrate of the nonvolatile memory cell. With a positive gate-to-drain/source bias and a positive P-well-to-N-well bias, electrons are emitted from the N well, injected into the P well and trapped in the cell, where the substrate 106 acts as the P well according to this particular embodiment of the invention. An N well 109 is formed to enclose the substrate 106. A P+ area 108 is formed in the P well, which is located, but not limited, to the right side of the N+ drain area 101 according to this embodiment. The P+ area 108 is metalized to serve as a joint to be connected to an outer component. The N well 109 further enclosing the P well includes an N+ area 110. The N+ area 110 is located at, but not limited to, one side of the P+ area 108. The N+ area 110 is metalized to serve a joint to be connected to an outer component. A voltage is provided between the gate 102 and the N well 109 so as to pump electrons from the N well to the semiconductor substrate 106 which then flow to the trapping layer 104. The N well of this relatively large size as illustrated in FIG. 12 advantageously provides a significantly large amount of electrons to be injected to the trapping layer by using a relatively small voltage.

It should be understood that the particular amounts of voltages described herein and above in conjunction with FIG. 12 simply encompass one set of available conditions for performing the erase operation for the nonvolatile memory in accordance with the invention.

Figure 13:
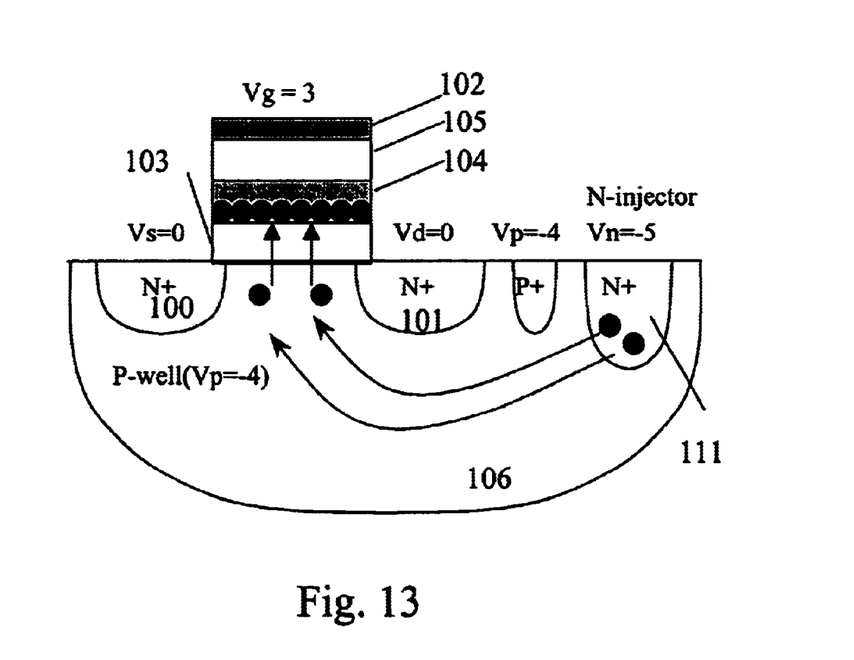
FIG. 13 illustrates an additional exemplary erase operation of the nonvolatile memory cell according to the invention using electron injection using electron injection with hot electrons emitted from the N injector.

FIG. 13 illustrates an additional exemplary erase operation of the nonvolatile memory cell according to the invention using electron injection with hot electrons emitted from N injector. The nonvolatile memory cell according to the invention is erased by hot electron injection, where an N+ injector is provided in the substrate of the nonvolatile memory cell. With a positive gate-to-drain/source bias and a positive P-well-to-N+ injector bias, electrons are emitted from the N+ injector, and then injected into the P well where they are trapped in the memory cell, where the substrate 106 acts as the P well according to this particular embodiment of the invention. An N+ injector 111 is formed in the P well, which serves to provide electrons to the P well which are then injected to the trapping layer 104. A P+ area 108 is formed in the P well. The P+ area 108 is metalized to serve as a joint to be connected to an outer component. According to this embodiment of the invention, the N+ injector 111 and P+ area 108 are located at, but not limited to, the right side of the N+ drain area 101. A voltage is provided between the gate 102 and the N+ injector 110 so as to pump electrons from the N+ injector into the P well which then flow to the trapping layer 104. The N well of this relatively large size as illustrated in FIG. 12 advantageously provides a significantly large amount of electrons to be injected to the trapping layer by using a relatively small voltage.

For programming the nonvolatile memory in accordance with the invention, the channel is turned off. No current will flow from the drain 101 to the source 100, or along a reverse path as a result. Thus, the invention advantageously prevents the occurrence of punch-through effects which result in large leakage current, high power consumption and low programming efficiency, and the two bits in the memory cell can be well identified. For the erase operation, electrons are stored in the trapping layer where the energy barrier in the channel is increased. The level of the energy barrier in the channel is uniformly distributed in the regions covering the two bits, a bit 1 and a bit 2, in the nonvolatile memory cell. As bit 1 is programmed, the energy barrier on the side of bit 1 is lowered by depleting the trapped electrons or hot holes injecting, compensating and recombining the amount of carriers in the trapping layer. As bit 2 is programmed, the energy barrier in the side of bit 2 is lowered by depleting thetrapped electrons or hot holes injecting, compensating and recombining the amount of carriers in the trapping layer. When the bits 1 and 2 are programmed, both energy barriers of bit 1 and bit 2 are lowered. Since the voltage from the gate will cut off the channel, no current will punch through the channel. Current paths are only formed between the drain and the trapping layer or between the source and the trapping layer. When the bits 1 and 2 in the trapping layer are very close (e.g., adjacent to one another), there is advantageously no resolution reduction for identifying the two bits.

In above embodiment, the method for programming the trapping layer is by injecting holes to the layer. As holes are injected to the trapping layer, it has the effect of reducing net charges in the trapping layers. Drawing electrons out of the trapping layers also achieve substantially the same result. Thus, the method of drawing electrons out of the trapping layer to achieve the object of programming the nonvolatile memory cells is also within the scope of the present invention.

Although the invention has been described with reference to the preferred embodiments, it will be understood that the invention is not limited to the details described thereof. Substitutions and modifications have been suggested in the foregoing description, and others will occur to those of ordinary skill in the art. In particular, the process steps of the method according to the invention will include methods having substantially the same process steps as the method of the invention to achieve substantially the same result. Therefore, all such substitutions and modifications are intended to be within the scope of the invention as defined in the appended claims and their equivalents.

We claim:

1. A trapping nonvolatile memory cell comprising:
   a P type semiconductor substrate comprising a source, a drain spaced from said source, and a channel region formed between said source and said drain;
   a first isolating layer overlying and covering said channel region;
   a nonconducting charge trapping layer overlaying said first isolating layer;
   a second isolating layer overlaying said nonconducting charge trapping layer; and
   a gate overlaying said second isolating layer;
   said nonconducting charge trapping layer receiving and retaining electrons in an erase state for said memory cell, and receiving electric hole injection in a programming state so that a net charge of said nonconducting charge trapping layer is reduced in the programming state.

2. The memory cell of claim 1 wherein said source is a buried N+ junction area.

3. The memory cell of claim 1 wherein said drain is a buried N+ junction area.

4. The memory cell of claim 1 wherein said gate is made of an electrically conductive material.

5. The memory cell of claim 1 wherein said first and second isolating layers are made of silicon oxide.

6. The memory cell of claim 1 wherein said nonconducting charge trapping layer is made of.

7. The memory cell of claim 1 further comprising a tunnel layer between the channel region and the first isolating layer, the tunnel layer overlying and covering said channel region wherein said tunnel layer includes energy barriers for electrons and electric holes which are lower than those of said first isolating layer.

8. The memory cell of claim 7 wherein said tunnel layer is made of one selected from the group consisting of titanium oxide and BST (barium, strontium and tantalum compound).

9. A method for a trapping nonvolatile memory cell comprising:
   providing a P type semiconductor substrate;
   forming a source, a drain spaced from said source, and a channel region between said source and said drain;
   forming a first isolating layer overlying and covering said channel region;
   forming a nonconducting charge trapping layer overlaying said first isolating layer;
   forming a second isolating layer overlaying said nonconducting charge trapping layer;
   forming a gate overlaying said second isolating layer;
   injecting electrons in said nonconducting charge trapping layer in an erase state of said memory cell; and
   injecting electric holes in said nonconducting charge trapping layer in a programming state.

10. The method of claim 9 further comprising forming a tunnel layer between the channel region and the first isolation layer, the tunnel layer overlying and covering said channel region wherein said tunnel layer includes energy barriers for electrons and electric holes which are lower than those of said first isolating layer.

11. The method of claim 10 wherein said tunnel layer is made of one selected from the group consisting of titanium oxide and BST (barium, strontium and tantalum compound).

12. The method of claim 9 further comprising:
applying a first voltage difference between a first electrode of said source and said drain and said gate wherein said first voltage difference is applied to cut off current flow from said first electrode to said gate; and
applying a second voltage difference between said gate and a second electrode of said source and said drain wherein said second voltage difference is applied to form an electric field which causes a current along a path from said second electrode to said trapping layer;
wherein said memory cell is in said programming state; and
wherein one bit of said memory cell is programmed.

13. The method of claim 9 further comprising:
applying a first voltage difference between a first electrode of said source and said drain and said gate wherein said first voltage difference is applied to form an electric field which causes a current along a path from said first electrode to said trapping layer; and
applying a second voltage difference between said gate and a second electrode of said source and said drain wherein said second voltage difference is applied to form a second electric field which causes a second current along a second path from said second electrode to said trapping layer;
wherein said memory cell is in said programming state; and
wherein two bits of said memory cell are programmed.

14. The method of claim 9 further comprising:
applying a first voltage difference between a first electrode of said source and said drain and said gate; and
applying a second voltage difference between said gate and a second electrode of said source and said drain wherein said second voltage difference is applied to turn on said second electrode and said gate; and
reading a bit state of said first electrode;
wherein one bit of said memory cell is read.

15. The method of claim 9 further comprising:
applying a voltage difference between said gate and said semiconductor substrate wherein said voltage is applied to cause an electric current flowing along a path from said semiconductor substrate to said trapping layer;
wherein said memory cell is in said erase state.

16. The method of claim 9 further comprising:
applying a voltage difference between said gate and said semiconductor substrate wherein said voltage is applied to cause an electric current flowing along a length from said gate to said trapping layer;
wherein said memory cell is in said erase state.

17. The method of claim 9 further comprising:
applying a first voltage to said gate;
grounding said semiconductor substrate;
inputting a series of bipolar pulses to a first electrode of said drain and said source;
floating a second electrode of said drain and source;
wherein each of said bipolar pulses further comprising a second voltage and a third voltage smaller than said second voltage wherein said third voltage is applied to cause electrons to be drawn out from said first electrode;
and wherein said second voltage is applied to cut off electron current flow from said first electrode to said semiconductor substrate, and to induce said electrons to be injected into said trapping layer to erase said trapping nonvolatile memory cell.

18. The method of claim 17 further comprising selecting a total number for said bipolar pulses for inducing charges to be stored in said trapping layer for erasing said trapping nonvolatile memory cell.

19. The method of claim 9 further comprising:
applying a first voltage to said gate;
grounding said semiconductor substrate;
inputting a series of bipolar pulses to said drain and said source synchronously;
each of said bipolar pulses further comprising a second voltage and a third voltage smaller than said second voltage;
wherein said third voltage is applied to cause electrons to be drawn out from said drain and said source;
wherein said second voltage is applied to cut off electron current flow from said drain and said source to said semiconductor substrate, and to induce electrons to be injected into said trapping layer from said semiconductor substrate to erase said trapping nonvolatile memory cell.

20. The method of claim 19 further comprising selecting a total number for said bipolar pulses for inducing charges to be stored in said trapping layer for erasing said mapping nonvolatile memory cell.

21. The method of claim 9 further comprising:
applying a first voltage to said gate;
grounding said drain and said source;
inputting a series of bipolar pulses to said semiconductor substrate;
each of said bipolar pulses further comprising a second voltage and a third voltage smaller than said second voltage;
wherein said second voltage is applied to cause electrons to be drawn out from said drain and said source;
wherein said third voltage is applied to cut off electron current flaw from said drain and said source to said semiconductor substrate, and to cause electrons to be injected into said trapping layer from said semiconductor substrate to erase said trapping nonvolatile memory cell.

22. The method of claim 21 further comprising selecting a total number for said bipolar pulses for inducing charges to be stored in said trapping layer for erasing said trapping nonvolatile memory cell.

23. The method of claim 9 further comprising:
providing an N well enclosing said semiconductor substrate; and
applying voltages to said gate, said P type semiconductor substrate and said N well to cause an electron current path which induces electrons to flow from said N well to said P type semiconductor substrate and to be injected into said trapping layer through said first isolating layer.

24. The method of claim 23 further comprising forming a P+ area in said P type semiconductor substrate.

25. The method of claim 23 further comprising forming an N+ area in said N well.

26. The method of claim 9 further comprising:
providing an N+ injector in said semiconductor substrate;
grounding said drain and said source; and
applying voltages to said gate, said P type semiconductor substrate and said N+ injector to cause an electron current path which induces electrons to flow from said N+ injector to said P type semiconductor substrate and to be injected into said tapping layer through said first isolating layer.

27. The method of claim 26 further comprising forming a P+ area in said P type semiconductor substrate.

28. A trapping nonvolatile memory cell comprising:
a P type semiconductor substrate comprising a source, a drain spaced from said source, and a channel formed between said source and said drain;
a tunnel layer overlying said channel;
a first isolating layer overlying said tunnel layer, wherein said tunnel layer has energy barriers for electrons and electric holes which are lower than those of said first isolating layer;
a nonconducting charge trapping layer overlaying said first isolating layer;
a second isolating layer overlaying said nonconducting charge trapping layer; and
a gate overlaying said second isolating layer.

29. The memory cell of claim 28 wherein said source is a buried N+ injection area.

30. The memory cell of claim 28 wherein said drain is a buried N+ injection area.

31. The memory cell of claim 28 wherein said gate is made of an electrically conductive material.

32. The memory cell of claim 28 wherein said first and second isolating layers are made of silicon oxide.

33. The memory cell of claim 28 wherein said nonconducting charge trapping layer is made of nitride.

34. The memory cell of claim 28 wherein said tunnel layer is made of one selected from the group consisting of titanium oxide and BST (barium, strontium and tantalum compound).

35. The memory cell of claim 28 wherein said nonconducting charge trapping layer stores electrons in an erase state of said memory cell, and receives electric hole injection in programming said memory cell.

* * * * *